(12) United States Patent
Katti (10) Patent No.: US 11,963,462 B2
(45) Date of Patent: Apr. 16, 2024

(54) MAGNETO-RESISTIVE RANDOM ACCESS MEMORY MAGNETIC TUNNEL JUNCTION AND CELL WITH VOLTAGE-CONTROLLED WRITING

(71) Applicant: Honeywell International Inc., Charlotte, NC (US)

(72) Inventor: Romney R. Katti, Shorewood, MN (US)

(73) Assignee: Honeywell International Inc., Charlotte, NC (US)

(*) Notice: Subject to any disclaimer, the term of this patent is extended or adjusted under 35 U.S.C. 154(b) by 113 days.

(21) Appl. No.: 17/698,146

(22) Filed: Mar. 18, 2022

(65) Prior Publication Data

US 2023/0301198 A1 Sep. 21, 2023

(51) Int. Cl.
*G11C 11/00* (2006.01)
*G11C 11/16* (2006.01)
(Continued)

(52) U.S. Cl.
CPC ............ *H10N 50/80* (2023.02); *G11C 11/161* (2013.01); *G11C 11/1673* (2013.01);
(Continued)

(58) Field of Classification Search
CPC ............. G11C 11/161; G11C 11/1673; G11C 11/1675; H10B 61/22; H10N 50/85; H10N 50/80
(Continued)

(56) References Cited

U.S. PATENT DOCUMENTS 8,004,881 B2 * 8/2011 Zhu ............... G11C 11/1655
365/158
10,134,457 B1 11/2018 Mihajlovic et al.
(Continued)

FOREIGN PATENT DOCUMENTS

CN 111540395 A 8/2020
CN 111834522 A 10/2020
WO 2021102750 A1 6/2021

OTHER PUBLICATIONS

Maciel et al., "Magnetic Tunnel Junction Applications", Sensors 2020, 20, 121, Dec. 24, 2019, pp. 1 through 20, MDPI, www.mdpi.com/journal/sensors.
(Continued)

*Primary Examiner* — Tha-O H Bui
(74) *Attorney, Agent, or Firm* — Fogg & Power LLC (57) ABSTRACT

A memory device has a magnetic tunnel junction (MTJ) element that includes a free layer structure, a free/pinned layer structure, and a tunnel barrier structure between the free layer structure and the free/pinned layer structure. A first electrode is coupled to the free layer structure, and a second electrode is coupled to the free/pinned layer structure. Processing circuitry is operatively coupled to the MTJ element. The processing circuitry is configured to apply a voltage to the MTJ element to modulate magnetic anisotropy using an electric field, to enable writing with reduced write currents; issue a charge current to the MTJ element to induce spin-dependent writing and magnetic spin accumulation in the free layer structure to set a bit state of the MTJ element, using spin-transfer torque into the free layer structure; and remove the voltage from the MTJ element that modulates the magnetic anisotropy, to perform a write operation.

20 Claims, 5 Drawing Sheets

(51) Int. Cl.
H10B 61/00 (2023.01)
H10N 50/80 (2023.01)
H10N 50/85 (2023.01)

(52) U.S. Cl.
CPC .......... *G11C 11/1675* (2013.01); *H10B 61/22* (2023.02); *H10N 50/85* (2023.02)

(58) Field of Classification Search
USPC ........................................................ 365/158
See application file for complete search history.

(56) References Cited

U.S. PATENT DOCUMENTS

| | | | |
|---|---|---|---|
| 10,490,736 B2 | 11/2019 | Saito et al. | |
| 10,762,942 B1 | 9/2020 | Katti | |
| 10,763,425 B1 | 9/2020 | Katti | |
| 10,847,197 B2 | 11/2020 | Buhrman et al. | |
| 2011/0116302 A1* | 5/2011 | Lu | G11C 11/1675 365/158 |
| 2018/0268887 A1 | 9/2018 | Endo et al. | |
| 2020/0043535 A1* | 2/2020 | Bozdag | G11C 11/15 |

OTHER PUBLICATIONS

Nozaki, et al. "Recent Progress in the Voltage-Controlled Magnetic Anisotropy Effect and the Challenges Faced in Developing Voltage-Torque MRAM", Michromachines 2019, 10, 327, May 15, 2019, pp. 1 through 31, MDPI, www.mdpi.com/journal/micromachines.
Rana et al. "Towards Magnonic Devices Based on Voltage-Controlled Magnetic Anisotropy", Communications Physics 2:90, 2019, www.nature.com/comsphys.

* cited by examiner

MAGNETO-RESISTIVE RANDOM ACCESS MEMORY MAGNETIC TUNNEL JUNCTION AND CELL WITH VOLTAGE-CONTROLLED WRITING

BACKGROUND

In order to meet the need for memory devices that may be used in space and strategic applications, which need to be radiation-hardened and have non-volatility, magnetically-based memory devices such as magneto-resistive random access memory (MRAM) devices have been developed. Such MRAM devices can be integrated monolithically or in multi-chip modules for use in various applications. While first-generation toggle-bit MRAM devices are robust, with high endurance and high data retention performance, these devices have constrained scalability. While second-generation spin-transfer torque (STT) MRAM devices improve scalability, these devices constrain endurance and data retention.

Accordingly, there is a need for next generation MRAM devices, which improve scalability while also obtaining high endurance and high data retention performance, thus overcoming the limitations of first-generation and second-generation MRAM devices.

SUMMARY

A memory device comprises a magnetic tunnel junction (MTJ) element that includes a free layer structure, a free/pinned layer structure, and a tunnel barrier structure between the free layer structure and the free/pinned layer structure. A first electrode is coupled to the free layer structure, and a second electrode is coupled to the free/pinned layer structure. Processing circuitry is operatively coupled to the MTJ element. The processing circuitry is configured to apply a voltage to the MTJ element to modulate magnetic anisotropy using an electric field, to enable writing with reduced write currents; issue a charge current to the MTJ element to induce spin-dependent writing and magnetic spin accumulation in the free layer structure to set a bit state of the MTJ element, using spin-transfer torque into the free layer structure; and remove the voltage from the MTJ element that modulates the magnetic anisotropy, to perform a write operation.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A magneto-resistive random access memory (MRAM) magnetic tunnel junction (MTJ) and bit cell device with voltage-controlled writing is described herein.

The bit cell uses spin transfer with voltage modulation of the magnetic anisotropy in a free layer structure of the MTJ for writing, and the MTJ structure for read-back. In addition, multi-level bit cell architectures may also be implemented using the present MTJ and bit cell configuration. Various transistor/circuitry configurations can be added to create and integrate bit cell devices.

The MTJ and bit cell is a magnetic/spintronic device that provides desired non-volatile (and volatile) memory and data storage characteristics. The MTJ and bit cell configuration is provided to overcome first-generation and second-generation MRAM constraints by providing scalability, high endurance, and high data retention performance.

The present device offers materials and technological similarity and compatibility with MRAM bits and other sensing devices, such as accelerometers, gyroscopes, and pressure sensors, which may support integration, modularity, miniaturization, and packaging with embedded MRAM and application-specific integrated circuits (ASICS).

Further details related to the present device and method of operation thereof are described as follows and with reference to the drawings.

Figure 1:
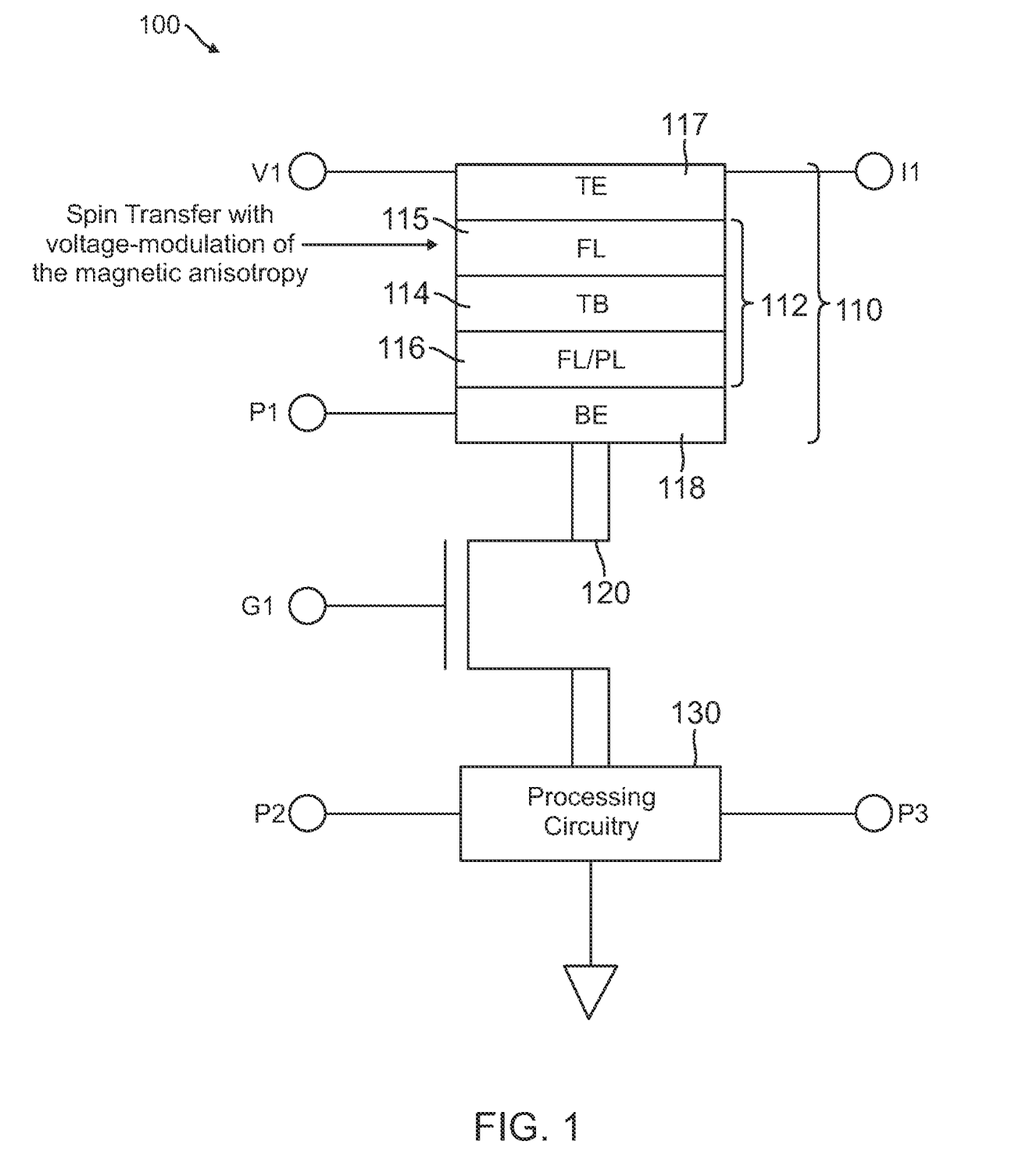
FIG. 1 schematically illustrates a magneto-resistive random access memory (MRAM) cell device with a magnetic tunnel junction (MTJ), according to one embodiment.

FIG. 1 schematically illustrates a MRAM cell device 100, according to one embodiment. The cell device 100 generally includes a multilayer thin film stack structure 110 with an MTJ element 112, a switching element 120, and processing circuitry 130.

The MTJ element 112 has multiple layers, including a tunnel barrier (TB) structure 114 that is sandwiched between a free layer (FL) structure 115 and a free/pinned layer (FL/PL) structure 116. In addition, stack structure 110 includes a top electrode (TE) 117 coupled to free layer structure 115, and a bottom electrode (BE) 118 coupled to free/pinned layer structure 116. The switching element 120 is connected to bottom electrode 118, and processing circuitry 130 is operatively coupled to MTJ element 112 through switching element 120. The switching element 120 and processing circuitry 130 are described in further detail hereafter.

The tunnel barrier structure 114 can be composed of various insulator materials, such as aluminum oxide (AlOx), magnesium oxide (MGO), carbon, graphene, polymers, ferroelectric materials, combinations thereof, or the like. Examples of suitable ferroelectric materials include barium titanate ($BaTiO_3$), perovskites, barium cobalt fluoride ($BaCoF_4$), lead titanate ($PbTiO_3$), lead zirconate titanate (PZT), lithium tantalate, ($LiTaO_3$), triglycine sulphate (TGS), as well as piezoelectrics, pyroelectrics, dielectrics, or the like. In nonlimiting examples, tunnel barrier structure 114 can be formed with an ultrathin layer of insulator material having a thickness of about 0.1 nm to about 2 nm. In one example embodiment, tunnel barrier structure 114 can be formed with an ultrathin layer of insulator material having a thickness of at least about 1 nm.

The free layer structure 115 can be composed of various ferromagnetic materials, such as a nickel-iron (NiFe) alloy, a cobalt-iron-boron (CoFeB) alloy, an iron-boron (FeB) alloy, an iron-cobalt (FeCo) alloy, nickel-iron-cobalt (NiFeCo) alloy, iron, ruthenium, combinations thereof, or the like. The free/pinned layer structure 116 can be composed of the same materials as free layer structure 115, or of a cobalt-platinum (CoPt) alloy, and the like. In nonlimiting examples, free layer structure 115 and free/pinned layer structure 116 can each be formed with a ferromagnetic material having a thickness of about 1 nm to about 1000 nm.

The top electrode 117 and bottom electrode 118 can be composed of various metallic materials, such as gold, tungsten, titanium, tantalum, copper, combinations thereof, or the like. As shown in FIG. 1, top electrode 117 is connected to a first node (V1) and a second node (I1), for respectively receiving a voltage from a voltage source and a current from a current source. In addition, bottom electrode 118 is connected to a third node (P1), which is a return for V1 and/or I1.

The cell device 100 can be manufactured using various standard thin film technology processes and photolithography. For example, the multiple layers of stack structure 110 can be formed using thin film fabrication techniques, such as various physical and/or chemical deposition techniques. In some examples, the thin film layers of MTJ element 112 can be formed using magnetron sputtering, molecular beam epitaxy, pulsed laser deposition, electron beam physical vapor deposition, or the like.

The free layer structure 115 can be formed to have a magnetization direction that is free to switch between a parallel orientation and an antiparallel orientation. The pinned layer of free/pinned layer structure 116 may include a magnetization direction that is fixed or "pinned" to a single orientation. For example, the pinned layer may be pinned in a parallel orientation, or may be pinned in an antiparallel orientation. The pinned layer may include an antiferromagnetic layer, such that the magnetization direction of the pinned structure is "pinned" in a particular orientation. In this case, the magnetization direction of the pinned layer remains relatively fixed when operational magnetic fields are applied to MTJ element 112.

In other embodiments, as described further hereafter, one or more intralayers or interlayers can be added to the tunnel barrier structure. For example, ferroelectric, dielectric, polymeric, and/or graphene intralayer(s) or interlayer(s) can be added in the middle of the tunnel barrier structure, or at the interface(s) with the free layer and/or free/pinned layer structures, to enhance magnetic anisotropy modulation. In addition, antiferromagnetic intralayer(s) or interlayer(s), such as ruthenium, can be added to the free layer and/or free/pinned layer structures for synthetic antiferromagnetic stabilization and moment balancing.

While the embodiment of FIG. 1 shows one MTJ element, in other examples, a cell device may include an array of MTJ elements in various configurations. An example array of MTJ elements is disclosed in U.S. Pat. No. 10,763,425, entitled MAGNETIC TUNNEL JUNCTION BASED PROGRAMMABLE MEMORY CELL, the disclosure of which is incorporated by reference.

The switching element 120, such as a transistor, is connected to a fourth node (G1). The switching element 120 may be configured by G1 to operate in a first state (e.g., switched-in) that generates an electrical channel coupling bottom electrode 118 to processing circuitry 130; and in a second state (e.g., switched-out) that refrains from generating the electrical channel coupling bottom electrode 118 to processing circuitry 130. Examples of switching element 120 may include a silicon-controlled rectifier (SCR), a Field Effect Transistor (FET), a bipolar junction transistor (BJT), or the like. Examples of FETs may include a junction field-effect transistor (HET), a metal-oxide-semiconductor FET (MOSFET), a dual-gate MOSFET, an insulated-gate bipolar transistor (IGBT), or the like The processing circuitry 130 is connected to a fifth node (P2) and a sixth node (P3), which respectively provide returns for V1 and/or I1 The processing circuitry 130 may include metallization and/or integrated circuitry; such as complementary metal-oxide-semiconductor (CMOS)). In addition, processing circuitry 130 may include an analog circuit. In some examples, processing circuitry 130 may include a microcontroller on a single integrated circuit containing processor core, memory, inputs, and outputs. In some examples, processing circuitry 130 can include a combination of one or more analog components and one or more digital components.

As indicated in FIG. 1, cell device 100 is operative to produce spin transfer with voltage modulation of the magnetic anisotropy in free layer structure 115 of MTJ element 112 for writing. The cell device 100 is operative to apply a voltage to and remove a voltage from MTJ element 112 to modulate the magnetic anisotropy, which is typically exchange or strain driven based on spin-spin or spin-orbit effects, using an electric field, to enable writing with reduced write currents. The magnetic anisotropy is typically monotonic if not linear with electric field.

In various embodiments, applying a voltage to (or removing a voltage from) MTJ element 112 can refer to applying (or removing) a positive voltage, a zero voltage, or a negative voltage.

The cell device 100 is also operative to issue a charge current, Ic, to induce spin-dependent writing and magnetic spin accumulation in free layer structure 115 to set the bit state of MTJ element 112 (subject to characteristic lengths of nanometers to micrometers, and characteristic times of picoseconds to nanoseconds), using spin-transfer torque into free layer structure 115.

The cell device 100 can also perform readback using tunneling magneto-resistive (TMR) effects, giant magneto-resistive (GMR) effects, or anisotropic magneto-resistive (AMR) effects, with a low voltage bias and current.

The processing circuitry 130 can perform a read operation on MTJ element 112 using a magneto-resistance of MTJ element 112 and output a result of the read operation. For example, processing circuitry 130 can determine that a state of MU element 112 is in a parallel magnetization state in response to determining that the magneto-resistance at MTJ element 112 is less than a threshold resistance. In some examples, processing circuitry 130 may determine that the state of MTJ element 112 is in an anti-parallel magnetization state in response to determining that the magneto-resistance at MTJ element 112 is not less than the threshold resistance.

In some examples, processing circuitry 130 may perform a read operation using switching element 120. As shown in FIG. 1, switching element 120 may be electrically coupled to the free/pinned layer structure 116 via bottom electrode 118. The MTJ element 112 and switching element 120 may form a series string. In this case, processing circuitry 130 may apply a read voltage across the series string and detect a sense voltage across switching element 120 while applying the read voltage. For example, processing circuitry 130 may determine that the magneto-resistance at MTJ element 112 is less than a threshold resistance in response to the sense voltage being greater than a voltage threshold, and determine the magneto-resistance at MU element 112 is not less than the threshold resistance in response to the sense voltage being not being greater than the voltage threshold.

In addition, processing circuitry 130 may use a magnetization direction (e.g., parallel orientation or anti-parallel orientation) of free layer structure 115 relative to free/pinned layer structure 116 to write a state (e.g., logical '1' or logical '0') of MTJ element 112. For example, processing circuitry 130 may receive an instruction to set MTJ element 112 to a logical. '1' state, or may receive an instruction to set MTJ element 112 to a logical '0' state. In response to receiving the instruction, processing circuitry 130 may generate electrical current to modify a resistance of MTJ element 112 to correspond to a target state. For instance, processing circuitry 130 may generate a charge current, Ic, in top electrode 117 that induces spin accumulation (e.g., spin-up or spin-down), and spin transfer into free layer structure 115 via spin-orbit torque and spin coupling that sets a magnetization direction of free layer structure 115 according to the spin accumulation of electrode top 117.

Figure 2:
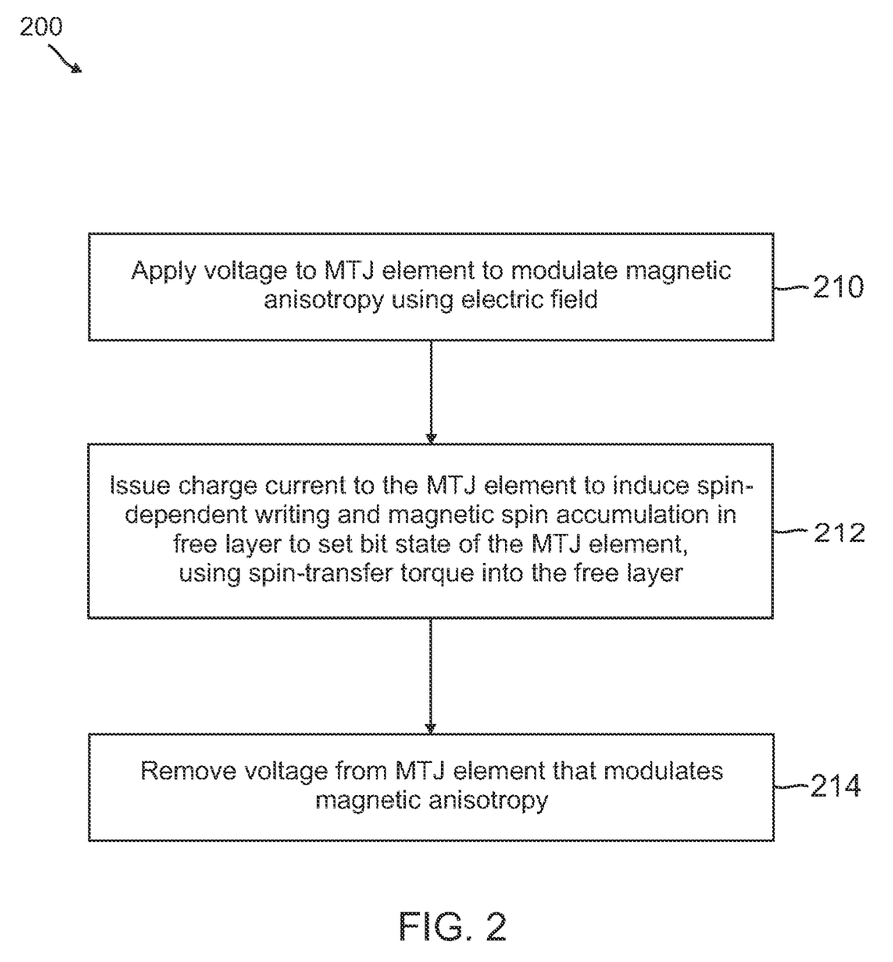
FIG. 2 is a flow diagram of an exemplary method performed by processing circuitry such as to operate the MRAM cell device of FIG. 1.

FIG. 2 is a flow diagram of a method 200, such as executed by processing circuitry 130 to operate cell device 100 in performing a write operation. The method 200 by applies a voltage to the MTJ element to modulate magnetic anisotropy using an electric field (block 210), which enables writing with reduced write currents. The method 200 also issues a charge current to the MTJ element to induce spin-dependent writing and magnetic spin accumulation in the free layer structure, to set a bit state of the MTJ element, using spin-transfer torque into the free layer structure (block 212). The method 200 then removes the voltage from the MTJ element that modulates the magnetic anisotropy (block 214), to perform the write operation.

A read operation can be performed when a read voltage is applied to the MTJ element, such that the magnetic anisotropy is maintained or increased to raise a write current threshold.

Figure 3:
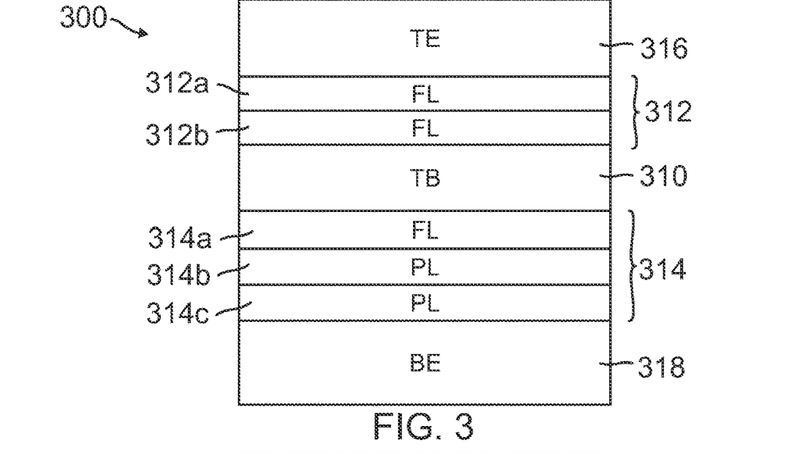
FIG. 3 schematically illustrates a multilayer stack structure for implementing a MTJ of a MRAM cell device, according to one example embodiment.

FIG. 3 illustrates a multilayer stack structure 300 for implementing a MTJ of a MRAM cell device, according to one example embodiment. The stack structure 300 includes a tunnel barrier (TB) structure 310, which is sandwiched between a free layer structure 312 and a free/pinned layer structure 314. The free layer structure 312 can include a first free layer 312a, and a second free layer 312b in a stacked (FL/FL) configuration. The free/pinned layer structure 314 can include a free layer 314a, a first pinned layer 314b, and a second pinned layer 314c in a stacked (FL/PL/PL) configuration. In addition, a top electrode (TE) 316 is coupled to free layer structure 312, and a bottom electrode (BE) 318 is coupled to free/pinned layer structure 314.

The various layers of multilayer stack structure 300 can be formed of the same materials and thicknesses as discussed above for corresponding layers of stack structure 110 (FIG. 1).

As mentioned above, in other embodiments, one or more intralayers or interlayers can be added to the tunnel barrier structure to enhance magnetic anisotropy modulation. In addition, antiferromagnetic intralayer(s) or interlayer(s) can be added to the free layer and/or free/pinned layer structures for synthetic antiferromagnetic stabilization and moment balancing. Further details related to examples of such embodiments are described as follows.

Figure 4:
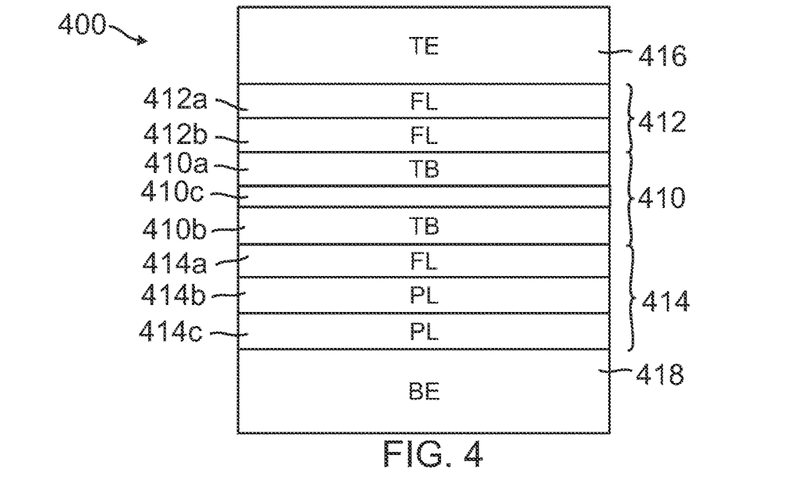
FIG. 4 schematically illustrates a multilayer stack structure for implementing a MTJ of a MRAM cell device, according to another example embodiment.

FIG. 4 illustrates a multilayer stack structure 400 for implementing a MTJ of a MRAM cell device, according to another example embodiment. The stack structure 400 includes a tunnel barrier structure 410, including a first tunnel barrier layer 410a, a second tunnel barrier layer 410b, and an intralayer 410c, which is formed between first and second tunnel barrier layers 410a, 410b. The intralayer 410c is formed to enhance the magnetic anisotropy modulation of the MTJ.

A free layer structure 412 is over first tunnel barrier layer 410a, and a free/pinned layer structure 414 is under second tunnel barrier layer 410b. In one embodiment, free layer structure 412 can include a first free layer 412a and a second free layer 412b in a stacked (FL/FL) configuration. The free/pinned layer structure 414 can include a free layer 414a, a first pinned layer 414b, and a second pinned layer 414c in a stacked (FL/PL/PL) configuration. In addition, a top electrode 416 is coupled to free layer structure 412, and a bottom electrode 418 is coupled to free/pinned layer structure 414.

The various layers of multilayer stack structure 400 can be formed of the same materials and thicknesses as discussed above for corresponding layers of stack structure 110 (FIG. 1). In addition, intralayer 410c can be formed with ferroelectric, dielectric, polymeric, and/or graphene materials.

Figure 5:
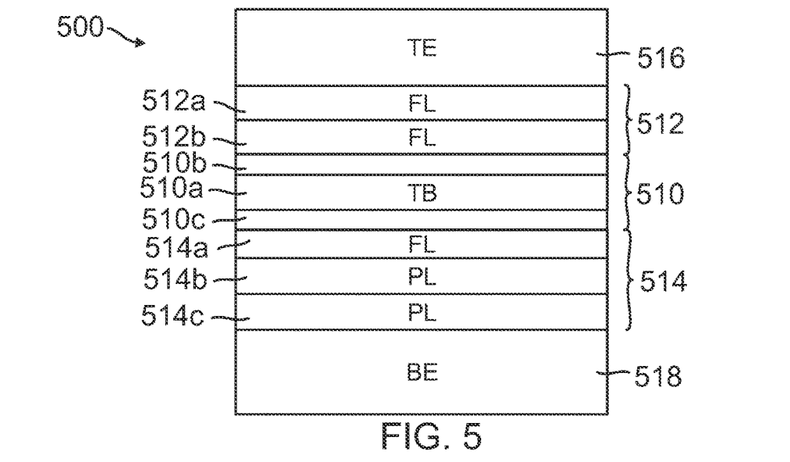
FIG. 5 schematically illustrates a multilayer stack structure for implementing a MU of a MRAM cell device, according to a further example embodiment.

FIG. 5 illustrates a multilayer stack structure 500 for implementing a MTJ of MRAM cell device, according to a further example embodiment. The stack structure 500 includes a tunnel barrier structure 510, including a tunnel barrier layer 510a, which is interposed between a first interlayer 510b and a second interlayer 510c. The interlayers 510b, 510c are formed to enhance the magnetic anisotropy modulation of the MTJ element.

A free layer structure 512 is over first interlayer 510b, and a free/pinned layer structure 514 is under second interlayer 510c. In one embodiment, free layer structure 512 can include a first free layer 512a and a second free layer 512b in a stacked (FL/FL) configuration. The free/pinned layer structure 514 can include a free layer 514a, a first pinned layer 514b, and a second pinned layer 514c in a stacked (FL/PL/PL) configuration. In addition, a top electrode 516 is coupled to free layer structure 512, and a bottom electrode 518 is coupled to free/pinned layer structure 514.

The various layers of multilayer stack structure 500 can also be formed of the same materials and thicknesses as discussed above for corresponding layers of stack structure 110 (FIG. 1). In addition, first and second intralayers 510b, 510c can be formed with ferroelectric, dielectric, polymeric, and/or graphene materials.

Figure 6:
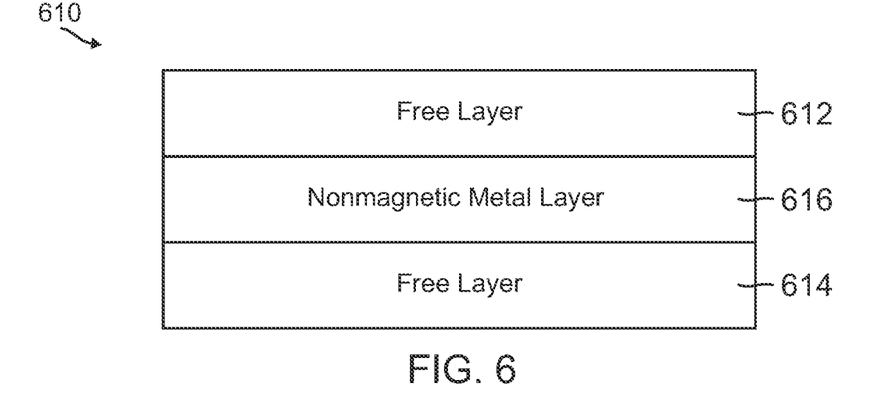
FIG. 6 schematically illustrates a free layer structure for a MTJ, according to one example embodiment, which can be utilized for implementing the MTJ in a MRAM cell device.

FIG. 6 illustrates a free layer structure 610 according to one example embodiment, which can be utilized in any of the above described multilayer stack structures for implementing the MTJ. The free layer structure 610 includes a first free layer 612, a second free layer 614, and an nonmagnetic metal layer 616, which is formed between first free layer 612 and second free layer 614. The nonmagnetic metal layer 616 is configured to stabilize a magnetic state of first and second free layers 612, 614, and to provide for moment balancing. The nonmagnetic metal layer 616 may be coupled to a layer of ruthenium, and composed of manganese (Mn) or Mn alloys, ferro manganese (FeMn), nickel manganese (NiMn), iridium manganese (IrMn), iron (II) oxide (FeO), iron (III) oxide ($Fe_2O_3$), manganese (II) oxide (MnO), nickel, copper, terbium iron cobalt (TbFeCo), combinations thereof, or the like. Although the example embodiment of FIG. 6 illustrates a free layer structure with two free layers, in other examples, a free layer structure may include more than two free layers (e.g., each pair of free layers spaced apart by a respective nonmagnetic metal layer layer).

Figure 7:
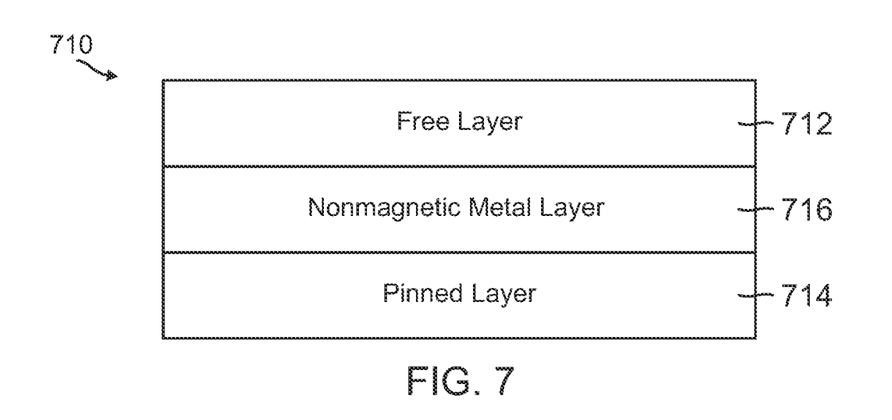
FIG. 7 schematically illustrates a free/pinned layer structure for an MTJ, according to one example embodiment, which can be utilized for implementing the MTJ in a MRAM cell device.

FIG. 7 illustrates a free/pinned layer structure 710 according to one example embodiment, which can be utilized in any of the above described multilayer stack structures for implementing the MTJ. The free/pinned layer structure 710 includes a free layer 712, a pinned layer 714, and a nonmagnetic metal layer 716, which is formed between free layer 712 and pinned layer 714. The nonmagnetic metal layer 716 is configured to stabilize a magnetic state of free layer 712 and pinned layer 714, and to provide for moment balancing. The nonmagnetic metal layer 716 may be coupled to a layer of ruthenium, and composed of manganese (Mn) or Mn alloys, ferro manganese (FeMn), nickel manganese (NiMn), iridium manganese (IrMu), iron (ii) oxide (FeO), iron (III) oxide ($Fe_2O_3$), manganese (II) oxide (MnO) nickel, copper, terbium iron cobalt (TbFeCo), combinations thereof, or the like. Although the example of FIG. 7 illustrates a free/pinned layer structure with one free layer and one pinned layer, other examples may include one or more additional free layers and/or pinned layers, spaced apart by a respective nonmagnetic metal layer.

Figure 8:
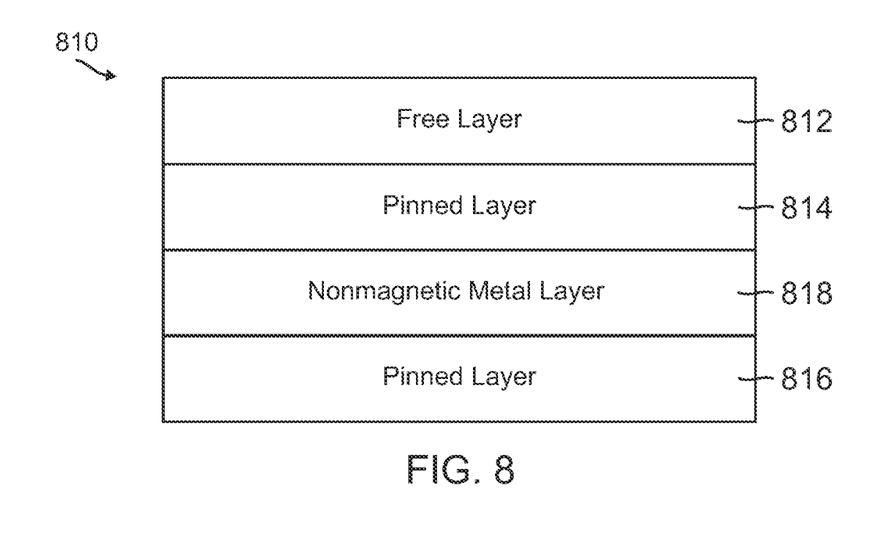
FIG. 8 schematically illustrates a free/pinned layer structure for an MTJ, according to another example embodiment, which can be utilized for implementing the MTJ in a MRAM cell device.

FIG. 8 depicts a free/pinned layer structure 810 according to another example embodiment, which can be utilized in any of the above described multilayer stack structures for implementing the MTJ The free/pinned layer structure 810 includes a free layer 812, a first pinned layer 814, and a second pinned layer 816. A nonmagnetic metal layer 818 is formed between first pinned layer 814 and second pinned layer 816. The nonmagnetic metal layer 818 is configured to stabilize a magnetic state of first and second pinned layers 814, 816, and to provide for moment balancing. The nonmagnetic metal layer 818 may be coupled to a layer of ruthenium, and composed of manganese (Mn) or Mn alloys, ferro manganese (FeMn), nickel manganese (NiMn), iridium manganese (IrMn), iron (II) oxide (FeO), iron (III) oxide ($Fe_2O_3$), manganese (II) oxide (MnO), nickel, copper, terbium iron cobalt (TbFeCo), combinations thereof, or the like.

Figure 9:
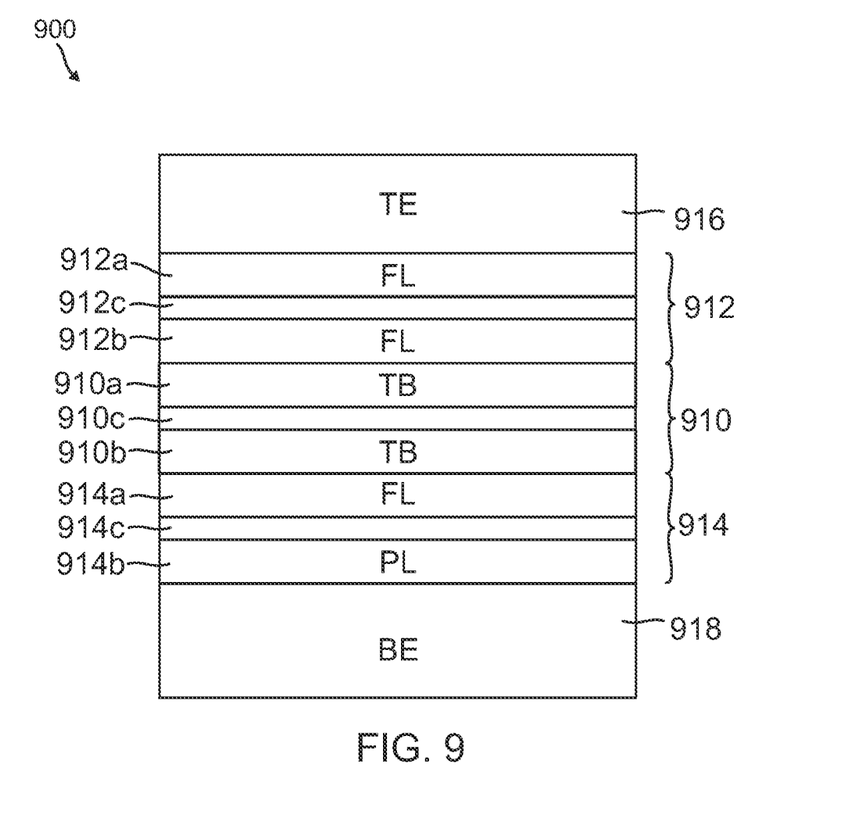
FIG. 9 schematically illustrates a multilayer stack structure for implementing a MTJ of a MRAM cell device, according to a further example embodiment.

FIG. 9 illustrates a multilayer stack structure 900 for implementing a MTJ of a MRAM cell device, according to a further example embodiment. The stack structure 900 includes a tunnel barrier structure 910, including a first tunnel barrier layer 910a, a second tunnel barrier layer 910b, and an intralayer 910c, which is formed between first and second tunnel barrier layers 910a, 910b. The intralayer 910c is formed to enhance the magnetic anisotropy modulation of the MTJ.

A free layer structure 912 is over first tunnel barrier layer 910a, and a free/pinned layer structure 914 is under second tunnel barrier layer 910b. The free layer structure 912 include a first free layer 912a, and a second free layer 912b, and an nonmagnetic metal layer 912c, which is formed between first free layer 912a and second free layer 912b. The free/pinned layer structure 914 includes a free layer 914a, a pinned layer 914b, and an nonmagnetic metal layer 914c, which is formed between free layer 914a and pinned layer 914b. In addition, a top electrode 916 is coupled to free layer structure 912, and a bottom electrode 918 is coupled to free/pinned layer structure 914.

The various layers of multilayer stack structure 900 can be formed of the same materials and thicknesses as discussed above for corresponding layers of stack structure 110 (FIG. 1). In addition, intralayer 910c can be formed with ferroelectric, dielectric, polymeric, and/or graphene materials. The nonmagnetic metal layer 912c and 914c are configured to provide for stabilization and moment balancing. The nonmagnetic metal layer 912c and 914c may be coupled to a layer of ruthenium, and composed of manganese (Mn) or Mn alloys, ferro manganese (FeMn), nickel manganese (NiMn), iridium manganese (IrMn), iron (II) oxide (FeO), iron (UT) oxide ($Fe_2O_3$), manganese (II) oxide (MnO), nickel, copper, terbium iron cobalt (TbFeCo), combinations thereof, or the like.

The processing circuitry used in the device and method described herein may be implemented using software, firmware, hardware, or appropriate combinations thereof. The processing circuitry may be supplemented by, or incorporated in, specially-designed ASICs or field programmable gate arrays (FPGAs). In some implementations, the processing circuitry may communicate through an additional transceiver with other computing devices outside of the system, such as those associated with a management system or computing devices associated with other subsystems controlled by the management system. The processing circuitry can also include or function with software programs, firmware, or other computer readable instructions for carrying out various process tasks, calculations, and control functions used in the method described herein.

The method described herein may be implemented by computer executable instructions, such as program modules or components, which are executed by at least one processor or processing unit. Generally, program modules include routines, programs, objects, data components, data structures, algorithms, and the like, which perform particular tasks or implement particular abstract data types.

Instructions for carrying out the various process tasks, calculations, and generation of other data used in the operation of the method described herein can be implemented in software, firmware, or other computer readable instructions. These instructions are typically stored on appropriate computer program products that include computer readable media used for storage of computer readable instructions or data structures. Such a computer readable medium may be available media that can be accessed by a general purpose or special purpose computer or processor, or any programmable logic device.

Suitable computer readable storage media may include, for example, non-volatile memory devices including semiconductor memory devices such as Random Access Memory (RAM), Read Only Memory (ROM), Electrically Erasable Programmable ROM (EEPROM), flash memory devices, FPGAs, or any other media that can be used to carry or store desired program code in the form of computer executable instructions or data structures.

Example Embodiments

Example 1 includes a device comprising: a magnetic tunnel junction (MTJ) element, the MTJ element comprising a free layer structure, a free/pinned layer structure, and a tunnel barrier structure between the free layer structure and the free/pinned layer structure; a first electrode coupled to the free layer structure; a second electrode coupled to the free/pinned layer structure; and processing circuitry operatively coupled to the MTJ element, the processing circuitry configured to: apply a voltage to the MTJ element to modulate magnetic anisotropy using an electric field, to enable writing with reduced write currents; issue a charge current to the MTJ element to induce spin-dependent writing and magnetic spin accumulation in the free layer structure to set a bit state of the MTJ element, using spin-transfer torque into the free layer structure; and remove the voltage from the MTJ element that modulates the magnetic anisotropy, to perform a write operation.

Example 2 includes the device of Example 1, further comprising: a switching element operatively coupled between the MTJ element and the processing circuitry, wherein the switching element and the MTJ element are configured as a series string.

Example 3 includes the device of Example 2, wherein the switching element, the MTJ element, and the processing circuitry are configured as a bit cell of a memory device.

Example 4 includes the device of Example 3, wherein the memory device comprises a magneto-resistive random access memory (MRAM) device.

Example 5 includes the device of Example 4, wherein the bit cell is operative to perform readback using a magneto-resistive effect comprising tunneling magnetoresistance (TMR), giant magnetoresistance (GMR), or anisotropic magnetoresistance (AMR).

Example 6 includes the device of any of Examples 1-5, wherein the bit cell is operative to perform a read operation when a read voltage is applied to the MTJ element, such that the magnetic anisotropy is maintained or increased to raise a write current threshold.

Example 7 includes the device of any of Examples 1-6, wherein the tunnel barrier structure includes at least one insulator layer comprising aluminum oxide, magnesium oxide, carbon, graphene, polymers, piezoelectric materials, pyroelectric materials, dielectric materials, ferroelectric materials, or combinations thereof.

Example 8 includes the device of Example 7, wherein the ferroelectric materials comprise barium titanate, perovskites, barium cobalt fluoride, lead titanate, lead zirconate titanate, lithium tantalate, triglycine sulphate, or combinations thereof.

Example 9 includes the device of any of Examples 7-8, wherein the tunnel barrier structure further includes one or more intralayers or interlayers effective to enhance the magnetic anisotropy modulation.

Example 10 includes the device of Example 9, wherein the one or more intralayers or interlayers comprise a ferroelectric material, a dielectric material, a polymeric material, graphene, or combinations thereof.

Example 11 includes the device of any of Examples 1-10, wherein the tunnel barrier structure has a thickness of about Example 0.1 nm to about 2 nm.

Example 12 includes the device of any of Examples 1-11, wherein the free layer structure includes at least one ferromagnetic layer comprising a nickel-iron alloy, a cobalt-iron-boron alloy, an iron-boron alloy, an iron-cobalt alloy, a nickel-iron-cobalt alloy, iron, ruthenium, or combinations thereof.

Example 13 includes the device of any of Examples 1-12, wherein the free layer structure further includes one or more intralayers effective to provide synthetic antiferromagnetic stabilization and moment balancing.

Example 14 includes the device of Example 13, wherein the one or more intralayers comprise a non-magnetic metal layer coupled to a layer of ruthenium, the non-magnetic metal layer comprising manganese or alloys thereof, ferro manganese (FeMn), nickel manganese (NiMn), iridium manganese. (IrMn), iron (II) oxide (FeO), iron (III) oxide ($Fe_2O_3$), manganese (II) oxide (MnO), nickel, copper, terbium iron cobalt (TbFeCo), or combinations thereof.

Example 15 includes the device of any of Examples 1-14, wherein the free layer structure has a thickness of about 1 nm to about 1000 nm.

Example 16 includes the device of any of Examples 1-15, wherein the free/pinned layer structure includes at least one free layer and at least one pinned layer, the free/pinned layer structure comprising a nickel-iron alloy, a cobalt-iron-boron alloy, an iron-boron alloy, an iron-cobalt alloy, a nickel-iron-cobalt alloy, iron, ruthenium, a cobalt-platinum alloy, or combinations thereof.

Example 17 includes the device of any of Examples 1-16, wherein the free/pinned layer structure includes a free layer (FL), a first pinned layer ($PL_1$), and a second pinned layer ($PL_2$) in a stacked $FL/PL_1/PL_2$ configuration.

Example 18 includes the device of any of Examples 1-17, wherein the free/pinned layer structure further includes one or more intralayers of an antiferromagnetic material that is effective to provide synthetic antiferromagnetic stabilization and moment balancing.

Example 19 includes the device of any of Examples 1-18, wherein the free/pinned layer structure has a thickness of about 1 nm to about 1000 nm.

Example 20 includes a method comprising: providing a bit cell device comprising a magnetic tunnel junction (MTJ) element and processing circuitry operatively coupled to the MTJ element, wherein the MTJ element includes a free layer structure, a free/pinned layer structure, and a tunnel barrier structure between the free layer structure and the free/pinned layer structure; applying a voltage to the MTJ element to modulate magnetic anisotropy using an electric field, to enable writing with reduced write currents; issuing a charge current to the MTJ element to induce spin-dependent writing and magnetic spin accumulation in the free layer structure to set a bit state of the MTJ element, using spin-transfer torque into the free layer structure; and remove the voltage from the MTJ element that modulates the magnetic anisotropy, to perform a write operation.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:
1. A device comprising:
 a magnetic tunnel junction (MTJ) element, the MTJ element comprising a free layer structure, a free/pinned layer structure, and a tunnel barrier structure between the free layer structure and the free/pinned layer structure;
 a first electrode coupled to the free layer structure, the first electrode connected to a first node and a second node, the first node configured to receive a voltage from a voltage source, and the second node configured to receive a charge current from a current or voltage source;
a second electrode coupled to the free/pinned layer structure, the second electrode connected to a third node configured as a return for the first node and/or the second node; and
processing circuitry operatively coupled to the MTJ element, the processing circuitry configured to:
apply a voltage to the MTJ element through the first node to modulate magnetic anisotropy in the free layer structure using an electric field, to enable writing with reduced write currents;
issue a charge current to the MTJ element through the second node to induce spin-dependent writing and/or magnetic spin accumulation in the free layer structure to set a bit state of the MTJ element, using spin-transfer torque into the free layer structure; and
remove the voltage from the MTJ element that modulates the magnetic anisotropy, to perform a write operation.

2. The device of claim 1, further comprising:
a switching element operatively coupled between the MTJ element and the processing circuitry, wherein the switching element and the MTJ element are configured as a series string.

3. The device of claim 2, wherein the switching element, the MTJ element, and the processing circuitry are configured as a bit cell of a memory device.

4. The device of claim 3, wherein the memory device comprises a magneto-resistive random access memory (MRAM) device.

5. The device of claim 4, wherein the bit cell is operative to perform readback using a magneto-resistive effect comprising tunneling magnetoresistance (TMR), giant magnetoresistance (GMR), or anisotropic magnetoresistance (AMR).

6. The device of claim 3, wherein the bit cell is operative to perform a read operation when a read voltage is applied to the MTJ element, such that the magnetic anisotropy is maintained or increased to raise a write current threshold.

7. The device of claim 1, wherein the tunnel barrier structure includes at least one insulator layer comprising aluminum oxide, magnesium oxide, carbon, graphene, polymers, piezoelectric materials, pyroelectric materials, dielectric materials, ferroelectric materials, or combinations thereof.

8. The device of claim 7, wherein the ferroelectric materials comprise barium titanate, perovskites, barium cobalt fluoride, lead titanate, lead zirconate titanate, lithium tantalate, triglycine sulphate, or combinations thereof.

9. The device of claim 7, wherein the tunnel barrier structure further includes one or more intralayers or interlayers effective to enhance the magnetic anisotropy modulation.

10. The device of claim 9, wherein the one or more intralayers or interlayers comprise a ferroelectric material, a dielectric material, a polymeric material, graphene, or combinations thereof.

11. The device of claim 1, wherein the tunnel barrier structure has a thickness of about 0.1 nm to about 2 nm.

12. The device of claim 1, wherein the free layer structure includes at least one ferromagnetic layer comprising a nickel-iron alloy, a cobalt-iron-boron alloy, an iron-boron alloy, an iron-cobalt alloy, a nickel-iron-cobalt alloy, iron, ruthenium, or combinations thereof.

13. The device of claim 1, wherein the free layer structure further includes one or more intralayers effective to provide synthetic antiferromagnetic stabilization and moment balancing.

14. The device of claim 13, wherein the one or more intralayers comprise a non-magnetic metal layer coupled to a layer of ruthenium, the non-magnetic metal layer comprising manganese or alloys thereof, ferro manganese (FeMn), nickel manganese (NiMn), iridium manganese (IrMn), iron (II) oxide (FeO), iron (III) oxide ($Fe_2O_3$), manganese (II) oxide (MnO), nickel, copper, terbium iron cobalt (TbFeCo), or combinations thereof.

15. The device of claim 1, wherein the free layer structure has a thickness of about 1 nm to about 1000 nm.

16. The device of claim 1, wherein the free/pinned layer structure includes at least one free layer and at least one pinned layer, the free/pinned layer structure comprising a nickel-iron alloy, a cobalt-iron-boron alloy, an iron-boron alloy, an iron-cobalt alloy, a nickel-iron-cobalt alloy, iron, ruthenium, a cobalt-platinum alloy, or combinations thereof.

17. The device of claim 1, wherein the free/pinned layer structure includes a free layer (FL), a first pinned layer ($PL_1$), and a second pinned layer ($PL_2$) in a stacked $FL/PL_1/PL_2$ configuration.

18. The device of claim 1, wherein the free/pinned layer structure further includes one or more intralayers of an antiferromagnetic material that is effective to provide synthetic antiferromagnetic stabilization and moment balancing.

19. The device of claim 1, wherein the free/pinned layer structure has a thickness of about 1 nm to about 1000 nm.

20. A method comprising:
providing a bit cell device comprising a magnetic tunnel junction (MTJ) element and processing circuitry operatively coupled to the MTJ element, wherein the MTJ element includes a free layer structure, a free/pinned layer structure, and a tunnel barrier structure between the free layer structure and the free/pinned layer structure;
wherein a first electrode is coupled to the free layer structure and a second electrode is coupled to the free/pinned layer structure, the first electrode connected to a first node and a second node, the first node operative to receive a voltage from a voltage source, and the second node operative to receive a charge current from a current or voltage source;
applying a voltage to the MTJ element through the first node to modulate magnetic anisotropy in the free layer structure using an electric field, to enable writing with reduced write currents;
issuing a charge current to the MTJ element through the second node to induce spin-dependent writing and/or magnetic spin accumulation in the free layer structure to set a bit state of the MTJ element, using spin-transfer torque into the free layer structure; and
removing the voltage from the MTJ element that modulates the magnetic anisotropy, to perform a write operation.

* * * * *